United States Patent
Hellberg et al.

(10) Patent No.: US 7,221,219 B2
(45) Date of Patent: May 22, 2007

(54) COMPOSITE AMPLIFIER STRUCTURE

(75) Inventors: Richard Hellberg, Huddinge (SE); Mats Klingberg, Enskede (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/537,986

(22) PCT Filed: Dec. 19, 2002

(86) PCT No.: PCT/SE02/02433

§ 371 (c)(1),
(2), (4) Date: Sep. 7, 2005

(87) PCT Pub. No.: WO2004/057755

PCT Pub. Date: Jul. 8, 2004

(65) Prior Publication Data
US 2006/0114060 A1 Jun. 1, 2006

(51) Int. Cl.
H03F 3/68 (2006.01)
(52) U.S. Cl. ............................ 330/124 R; 330/295
(58) Field of Classification Search ............ 370/124 R, 370/295, 84, 126
See application file for complete search history.

(56) References Cited

U.S. PATENT DOCUMENTS

| | | | |
|---|---|---|---|
| 5,012,200 A | 4/1991 | Meinzer | ............... 330/124 |
| 5,886,575 A | 3/1999 | Long | |
| 6,897,721 B2 * | 5/2005 | Hellberg | ............... 330/149 |
| 6,940,349 B2 * | 9/2005 | Hellberg | ............... 330/124 R |

FOREIGN PATENT DOCUMENTS

WO 01/91282 A2 11/2001

OTHER PUBLICATIONS

Doherty, "A New High Efficiency Power Amplifier for Modulated Waves", Proc. IRE, vol. 24, No. 9, pp. 1163-1182, Sep. 1936.
Chireix, "High Power Outphasing Modulation", Proc. IRE, vol. 23, No. 2, pp. 1370-1392, Nov. 1935.
Raab, "Efficiency of Doherty RF Power Amplifier Systems", IEEE Trans. Broadcasting, vol. BC-33, No. 3, pp. 77-83, Sep. 1987.
Raab, "Efficiency of Outphasing RF Power Amplifier Systems", IEEE Trans. Communications, vol. COM-33, No. 10, pp. 1094-1099, Oct. 1985.
Stengel et al., "LINC Power Amplifier combiner Method Efficiency Optimization", IEEE Trans. Vehicular Technology, vol. 49, No. 1, pp. 229-234, Jan. 2000.

* cited by examiner

Primary Examiner—Henry Choe
(74) Attorney, Agent, or Firm—Nixon & Vanderhye P.C.

(57) ABSTRACT

A composite power amplifier structure includes a first power amplifier configured as an auxiliary amplifier of a Doherty amplifier and connected to an output node and an even number of further power amplifiers configured into at least one Chireix pair connected to the same output node. The Chireix pairs are driven at least partially in outphasing modes and the first power amplifier is driven in the same manner as the auxiliary amplifier of a Doherty amplifier.

23 Claims, 17 Drawing Sheets

COMPOSITE AMPLIFIER STRUCTURE

This application is the US national phase of international application PCT/SE2002/002433, filed 19 Dec. 2002, which designated the U.S., the entire content of which is hereby incorporated by reference.

TECHNICAL FIELD

The present invention relates generally to an improved composite amplifier structure and a method of driving such an amplifier. The invention also relates to a radio terminal including such a structure.

BACKGROUND

In radio transmitters for broadcast, cellular, and satellite systems, the power amplifier (PA) in the transmitter has to be very linear, in addition to being able to simultaneously amplify many radio channels (frequencies) or independent user data channels, spread across a fairly wide bandwidth. It also has to do this efficiently, to reduce power consumption, need for cooling, and to increase its longevity. High linearity is required since nonlinear amplifiers would cause leakage of interfering signal energy between channels and distortion within each channel.

The amplitude probability density of a mix of sufficiently many independent radio frequency (RF) channels, or of a multi-user CDMA (Code Division Multiple Access) signal, tends to be close to a Rayleigh distribution having a large peak-to-average power ratio. Since a conventional linear RF power amplifier generally has an efficiency proportional to its output amplitude, its average efficiency is very low for such signals.

In response to the low efficiency of conventional linear power amplifiers when transmitting signals with large peak-to-average power ratio, two methods have been widely utilized: The Doherty method [1], and the Chireix outphasing method [2].

The Doherty amplifier uses one nonlinear and one linear amplifier. A first power amplifier is driven as a linear amplifier in class B, and a second power amplifier having nonlinear output current "modulates" the impedance seen by the first amplifier, through an impedance-inverting quarter-wave line [1, 3]. Since the nonlinear output current of the second amplifier is zero below a certain transition (output) voltage, the second amplifier does not contribute to the power loss below this voltage.

The standard Doherty amplifier's transition point (which corresponds to a maximum in the efficiency curve) is at half the maximum output voltage. The location of the transition point can be changed by changing the impedance of the quarter-wave transmission line (or equivalent circuit). Different size (power capacity) amplifiers will then be needed for optimum utilization of the available peak power. The Doherty system can be extended to three or more amplifiers, to obtain more maximum points on the efficiency curve. This usually leads to a requirement for very unevenly sized amplifiers (i.e. transistors).

The term "outphasing", which is the key method in Chireix and LINC amplifiers, generally means the method of obtaining amplitude modulation by combining several (generally two) phase-modulated constant-amplitude signals. These signals are produced in a "signal component separator" (SCS) and subsequently, after up-conversion and amplification through RF chains (mixers filters and amplifiers), combined to form an amplified linear signal in an output combiner network. The phases of these constant-amplitude signals are chosen so that the result from their vector-summation yields the desired amplitude. The compensating reactances +jX and −jX in the output network of the Chireix amplifier are used to extend the region of high efficiency to include lower output power levels. The efficiency of Chireix systems are derived in [4, 5].

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size amplifiers can be used.

Furthermore, a three-transistor amplifier (or more generally an odd number of transistors) using the outphasing principle is described in [6]. However, adding more amplifiers to the Chireix amplifier, as suggested in [6], has so far been unsuccessful in increasing the efficiency. In fact, the amplifier described in [6] is less efficient than a conventional Chireix amplifier with modified drive signals, as described in [7].

SUMMARY

An object of the present invention is to provide an efficient multi-stage composite power amplifier structure and a method for driving such a structure.

A further object is a radio terminal including such a structure.

These objects are achieved in accordance with the attached claims.

Briefly, the present invention suggests an efficient composite amplifier structure, which essentially is based on a combination of the auxiliary amplifier of a Doherty amplifier and at least one pair of amplifiers forming a Chireix pair. The Doherty part of the composite amplifier is driven in the same manner as the auxiliary amplifier of a Doherty amplifier. Each Chireix pair is driven by drive signals having amplitude dependent phase over at least a part of the dynamic range of the composite amplifier. Preferably different pairs have amplitude dependent phase in different parts of the dynamic range to maximize efficiency.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the following description the same reference designations will be used for the same or similar elements throughout the figures of the drawings.

Before the invention is described in detail, the Doherty and Chireix amplifiers will be described briefly with reference to FIGS. 1 and 2, respectively.

Figure 1:
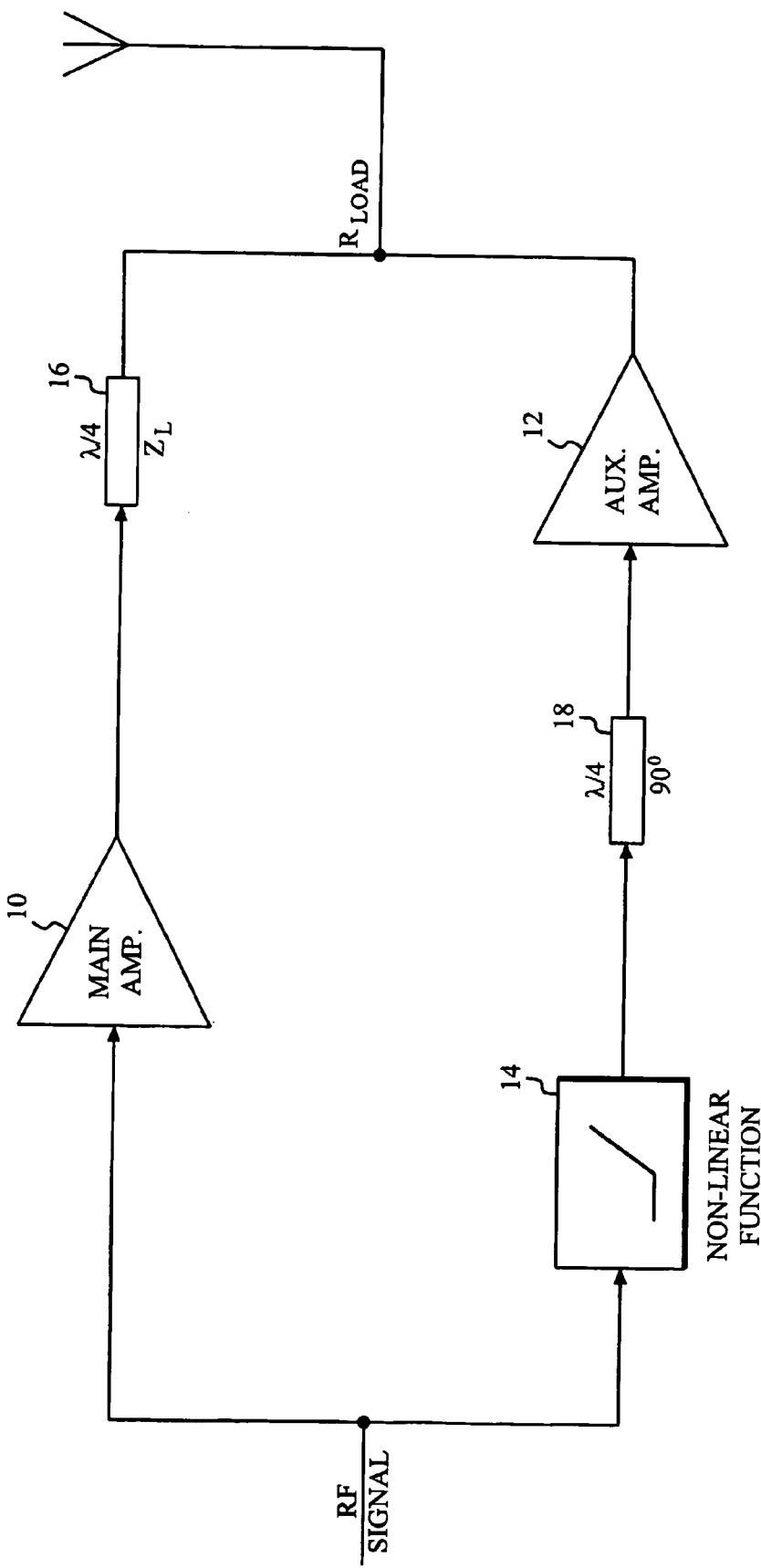
FIG. 1 is a block diagram of a prior art Doherty amplifier.

FIG. 1 is a block diagram of a typical prior art Doherty amplifier. The Doherty amplifier uses one linear and one nonlinear power amplifier. The published theory states that a main power amplifier 10 is driven as a linear amplifier in class B, and an auxiliary power amplifier 12 having nonlinear output current (through class C operation or some other technique represented by block 14) "modulates" the impedance seen by the main amplifier, through an impedance-inverting quarter-wave line 16 in the output network. The input path to the auxiliary amplifier also contains a 90° phase shifter 18. Since the nonlinear output current of the auxiliary amplifier is zero below a certain transition (output) voltage, the auxiliary amplifier does not contribute to the power loss below this voltage.

The transition point of the standard Doherty amplifier is at half the maximum output voltage. With this transition point the efficiency curve is most suited for moderate peak-to-average power ratios, and the peak power is divided equally between the two constituent amplifiers. The transition point in the Doherty amplifier can be changed by changing the impedance of the quarter-wave transmission line (or equivalent circuit). The efficiency curve can then be adjusted for higher peak-to-average power ratios, and the peak output power will be unequally divided between the amplifiers. Different size (power capacity) amplifiers will thus be needed for optimum utilization of the available peak power.

Figure 2:
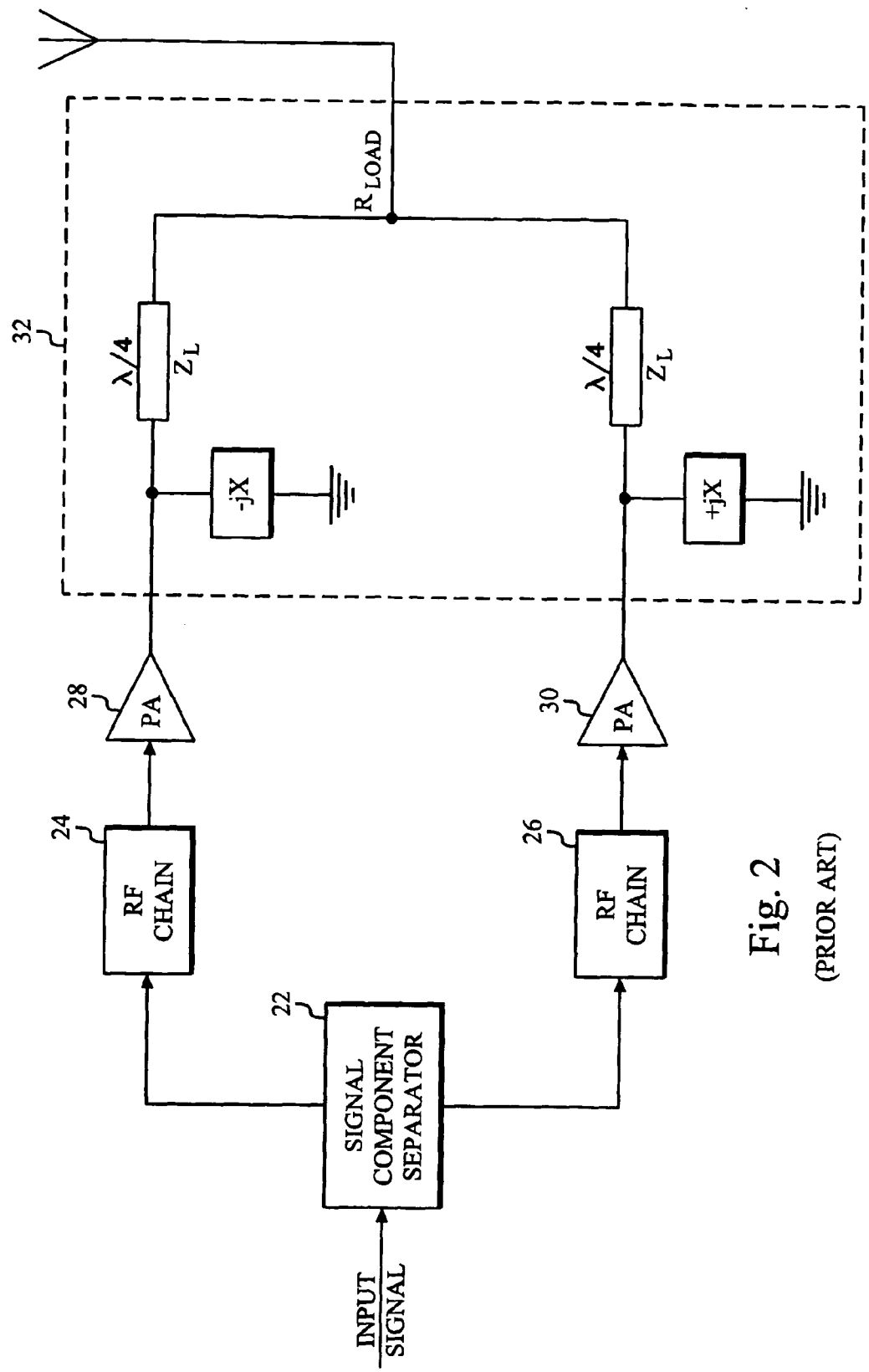
FIG. 2 is a block diagram of a typical prior art Chireix amplifier.

FIG. 2 is a block diagram of a typical prior art Chireix amplifier. The term "outphasing", which is the key method in Chireix and LINC amplifiers, generally means the method of obtaining amplitude modulation by combining two phase-modulated constant-amplitude signals produced in a signal component separator 22. After up-conversion and amplification through RF chains 24, 26 (mixers, filters, amplifiers) and power amplifiers 28, 30, the outphased signals are combined to form an amplified linear signal in a Chireix type output network 32. The phases of these constant-amplitude outphased signals are chosen so that the result from their vector-summation yields the desired amplitude. Output network 32 includes two quarter-wave lines $\lambda/4$ (where $\lambda$ is the wavelength of the center frequency of the frequency band at which the amplifier is operated) and two compensating reactances +jX and −jX, which are used to extend the region of high efficiency to include lower output power levels.

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size (power capacity) amplifiers can be used.

Figure 3:
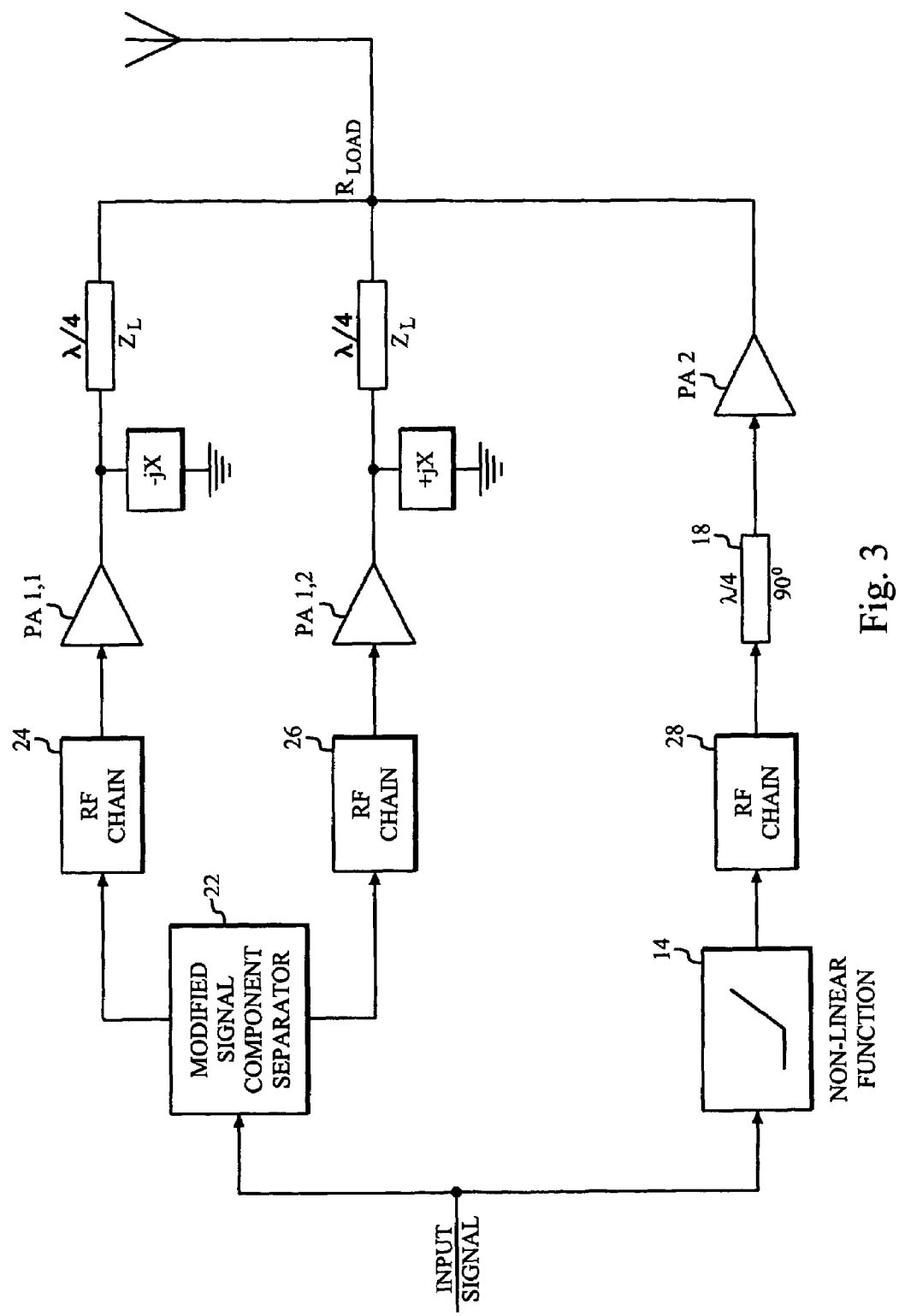
FIG. 3 is a block diagram of an exemplary embodiment of a composite amplifier structure in accordance with the present invention.

FIG. 3 is a block diagram of an exemplary embodiment of a composite amplifier in accordance with the present invention. As can be seen from the figure this embodiment essentially is a combination of a Chireix amplifier (including power amplifiers PA 1,1 and PA 1,2) with an auxiliary amplifier PA 2 of a Doherty amplifier. A slight modification in the "Doherty part" (compared to FIG. 1) is that the non-linear function is implemented in the baseband (for example as a lookup table and a D/A converter) instead of the RF band. For this reason a further RF chain 28 has been included in the input network. Furthermore, preferably the Chireix part signal component separator 22 is modified to generate outphased signals only in a certain region of the dynamic range of the composite amplifier structure. This modification will be described in detail with reference to FIGS. 6–10. The illustrated composite amplifier structure can be substituted for a single stand-alone amplifier, for example a class B (AB) linear RF amplifier or for one of the amplifiers in a Doherty system, provided the three amplifiers together have the same maximum output current as the amplifier they replace.

As indicated by antennas, the composite amplifier structure in accordance with the present invention may be part of a transmitter, for example a transmitter in a radio terminal, such as a base station or a mobile station in a cellular mobile radio communication system.

The following description will illustrate other possible composite power amplifier structures based on the idea of combining the Chireix and Doherty principles.

Figure 4:
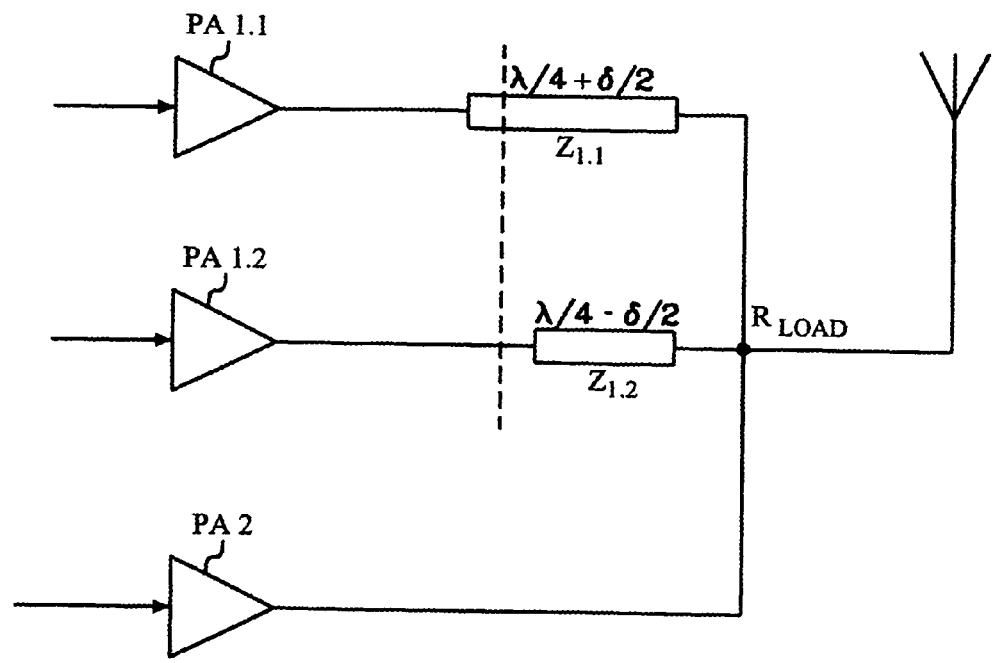
FIG. 4 is a block diagram of another exemplary embodiment of a composite amplifier structure in accordance with the present invention.
Figure 5:
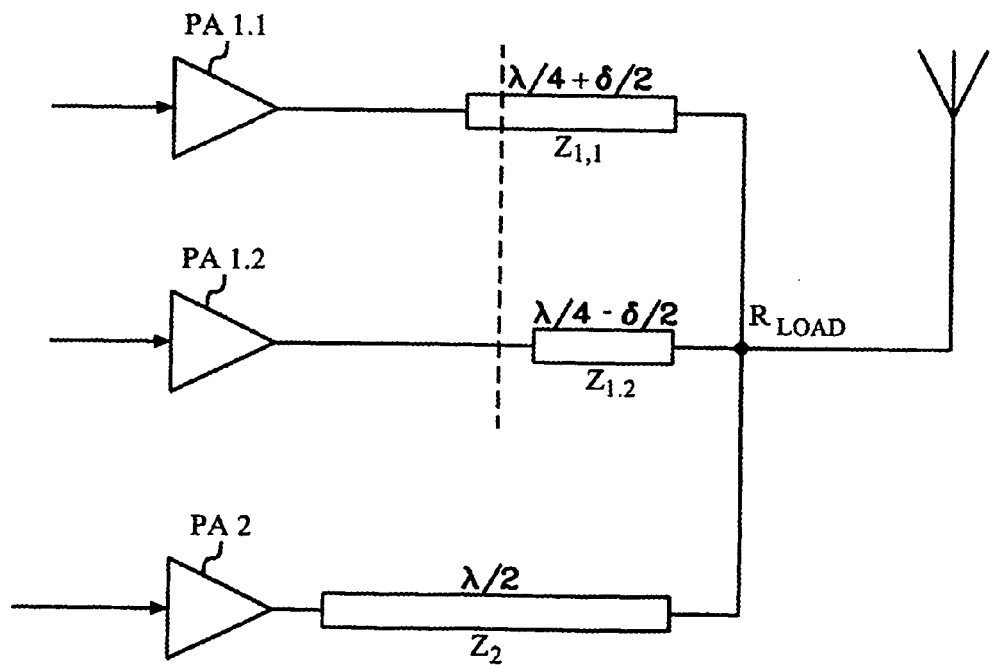
FIG. 5 is a block diagram of yet another exemplary embodiment of a composite amplifier structure in accordance with the present invention.

The composite amplifier in FIG. 3 includes a semi-lumped output network using quarter-wave transmission lines together with inductors (+jX) and capacitors (−jX). Another possibility is a distributed output network illustrated in FIG. 4. This structure uses only shortened and lengthened transmission lines. Another example is illustrated in FIG. 5. A half-wavelength transmission line from PA 2 is included in FIG. 5 for illustrative purposes; any number of half wavelengths of transmission line can be added to any of the amplifiers, with a corresponding change in the phase of the drive signal to that amplifier. In general, the Chireix part of the output network may be describes as including impedance inverting elements corresponding a total line length of $\lambda/2$ or lengthened and shortened elements having an average line length of $\lambda/4$. The Doherty part of the output network is non-inverting and corresponds to line lengths of 0, $\lambda/2$ or in general to $N*\lambda/2$, where N=0, 1, 2, . . . .

Other ways of implementing the output networks are by using only lumped elements, i.e. capacitors and inductors. In the lumped element implementation, pi-section or other lumped element networks replace the transmission lines. The reactances to ground from a certain node are then usually replaced with a single reactance having the equivalent parallel-connection value.

The quarter-wave lines (or their equivalent circuits) can also be used for transforming between the load and the transistors. More impedance-matching sections can also be used in each branch, and many other circuit transformation techniques are available.

If no other impedance transforming takes place in the output network, the transmission line impedances should be substantially equal to the optimal load resistance of each constituent amplifier. If the structure is used by itself, as a three-amplifier system, the transformed antenna impedance $R_{LOAD}$, connected at the denoted connection point, should equal the parallel connection of the optimal loads of all three constituent amplifiers.

Although the input network in FIG. 3 may in principle be driven as a combination of a classical Chireix outphasing mode for PA 1,1 and PA 1,2 and a non-linear Doherty mode for PA 2, more efficient drive modes will now be described.

The improved operation of a three-amplifier system can be subdivided into three main regions. At low output amplitudes, PA 1,1 and PA 1,2 are driven to supply linearly increasing (with respect to the output amplitude) currents with a constant phase angle between them. The upper boundary of this region is determined by the size of the reactances, X (FIG. 3), or equivalently, by the line length difference $\delta$ (FIG. 4). This parameter is usually chosen so that the average efficiency is maximized for the signal amplitude distribution used, by placing the lowermost efficiency maximum (see FIG. 10) at a certain output amplitude point. At medium output amplitudes, the same two amplifiers are driven in an outphasing fashion, with constant amplitudes and varying relative phase of their output node voltages. The upper boundary of the middle region is determined by the relation between the sum of the maximum output powers of PA 1,1 and PA 1,2 to the sum of all three amplifiers' maximum output power. At high output amplitudes PA 1,1 and PA 1,2 are held at constant voltage and constant phase difference while together supplying a substantially linearly increasing output current. In this region the third amplifier PA 2 is also active, supplying a linearly increasing current starting from zero.

As an illustration of the above description consider a system of three equal-sized amplifiers. This particular composite amplifier is implemented with transmission lines, according to FIG. 4 with a line length difference $\delta=0.041\lambda$.

Figure 6:
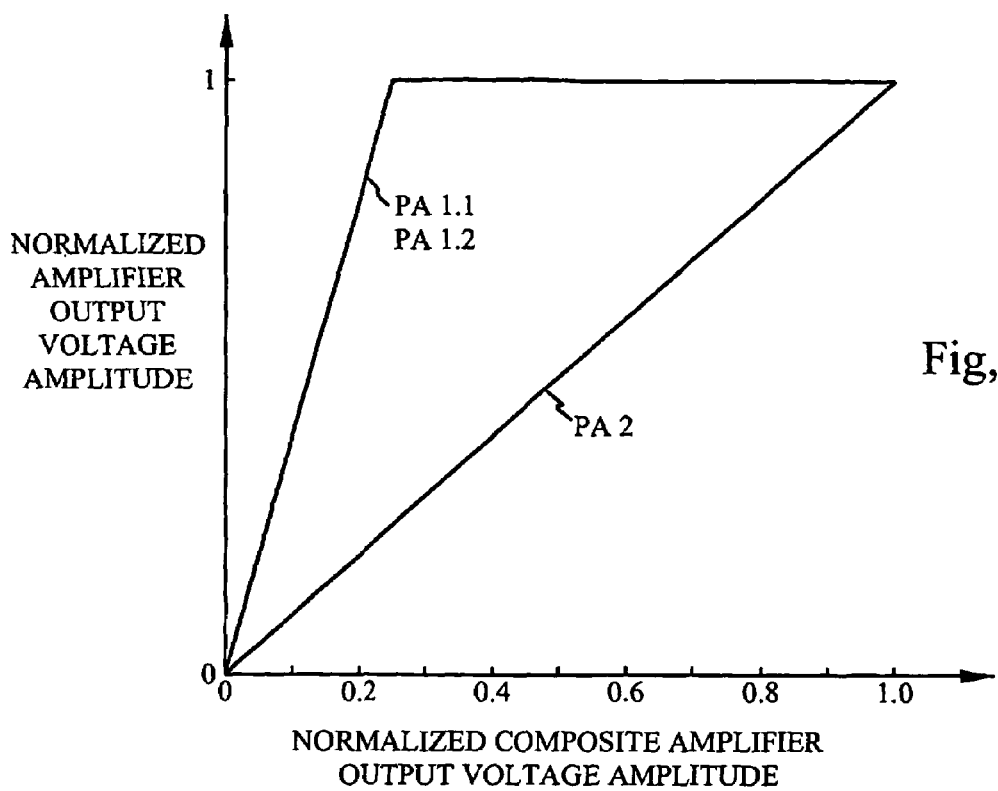
FIG. 6 is a diagram illustrating the dependence of the normalized output voltage amplitude of each amplifier on the normalized output voltage amplitude of the composite amplifier structure in accordance with FIG. 4.
Figure 7:
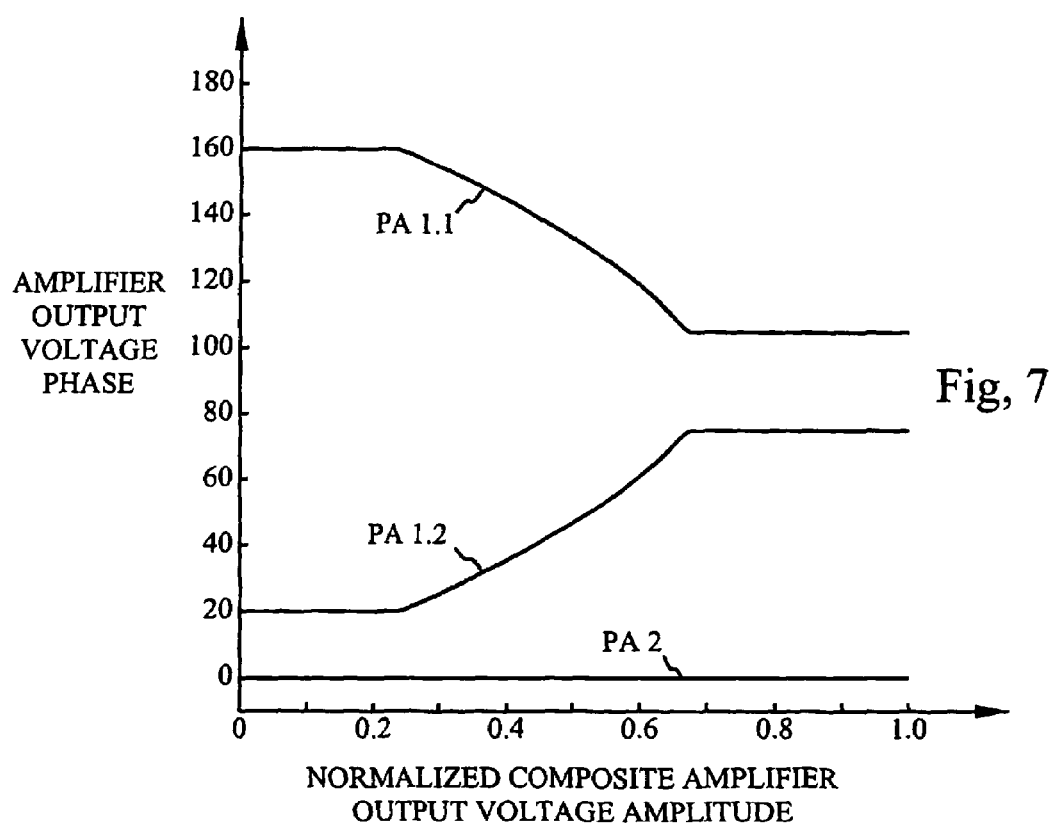
FIG. 7 is a diagram illustrating the dependence of the output voltage phase of each amplifier on the normalized output voltage amplitude of the composite amplifier structure in accordance with FIG. 4.

The amplitudes and phases of the voltages at the output nodes of the amplifiers are shown in FIG. 6 and FIG. 7, respectively. The voltage at PA 2 contains the desired output signal, which implies that its amplitude rises linearly with the output amplitude, while the voltages at PA 1,1 and PA 1,2 rise faster at low output amplitudes (up to about 0.23 of the maximum output amplitude), and are held constant at higher amplitudes. The phase of the voltage at PA 2 is the desired output signal phase. PA 1,1 and PA 1,2 start out, at low output amplitudes, with a constant relative phase difference, and constant offset to the phase of the output signal. From 0.23 to 0.67 of the maximum output amplitude, PA 1,1 and PA 1,2 operate in an outphasing fashion, and at output levels above 0.67 they have constant phase relative to the output.

Figure 8:
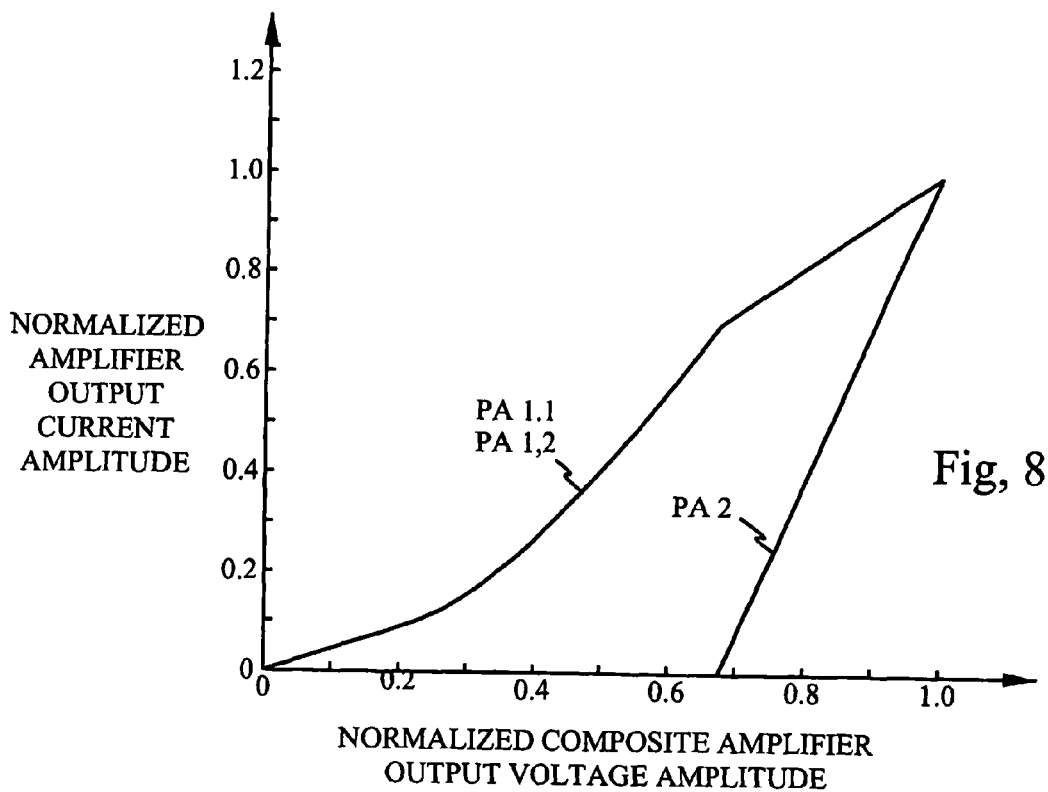
FIG. 8 is a diagram illustrating the dependence of the normalized output current amplitude of each amplifier on the normalized output voltage amplitude of the composite amplifier structure in accordance with FIG. 4.
Figure 9:
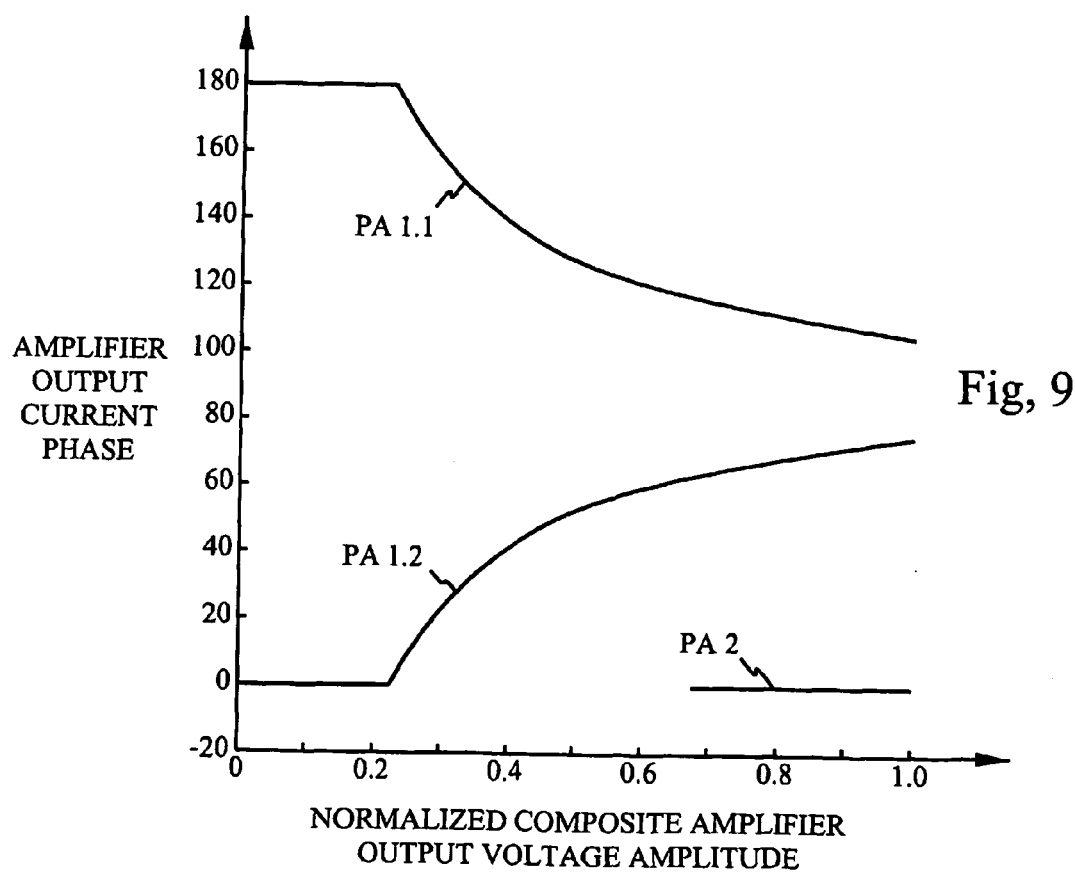
FIG. 9 is a diagram illustrating the dependence of the output current phase of each amplifier on the normalized output voltage amplitude of the composite amplifier structure in accordance with FIG. 4.
Figure 10:
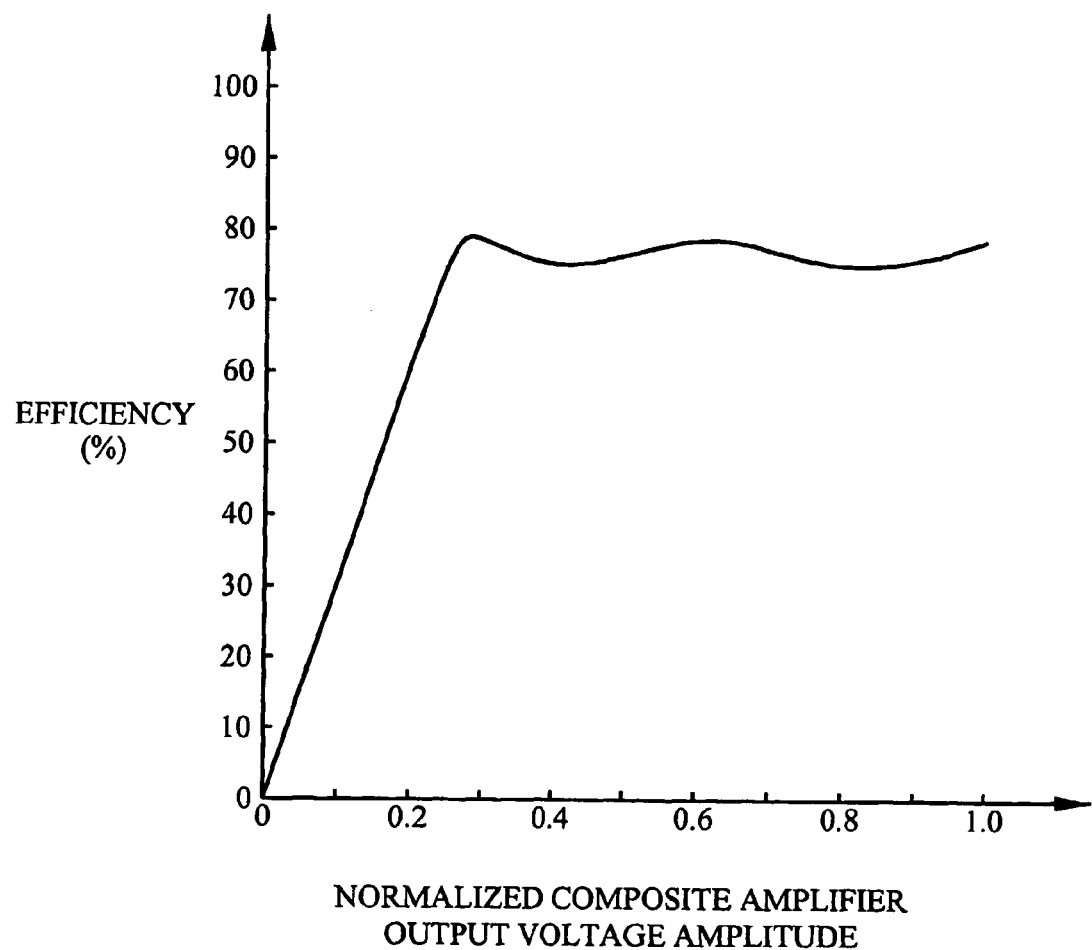
FIG. 10 is a diagram illustrating the efficiency as a function of the normalized output voltage of the composite structure in accordance with FIG. 4.

The amplitudes and phases of the RF currents delivered by the amplifiers are shown in FIG. 8 and FIG. 9, respectively. PA 1,1 and PA 1,2 deliver linear currents with constant phases, relative to the output, at low amplitudes. In the middle amplitude region these amplifiers are in an outphasing mode. At high output amplitudes, PA 2 is also active, while PA 1,1 and PA 1,2 continue to increase their output currents. In this region, the relative phases need to change, albeit less than in the outphasing region, to obtain optimal efficiency. The absence of a phase plot for PA 2 at low output amplitudes indicates that this is a "don't care" region, since the delivered current is zero anyway. The resulting efficiency for the three-amplifier system, assuming linear transistors in class B operation, is shown in FIG. 10.

A difference between operating the described structure within a Doherty system and operating it as a single stand-alone high-efficiency amplifier is that the choice of reactance value, or equivalently, line length difference, has new restrictions. These restrictions depend on which power amplifier in the Doherty system is replaced, since the different amplifiers in the Doherty system operate differently in the different regions of operation. The amplifiers in the Doherty system all start (at an output level of zero, for the first or main amplifier, or at a so called transition point at a higher output amplitude, for subsequent or auxiliary amplifiers) by delivering linear current (as a function of output voltage). In the region above the next transition point, the voltage amplitude at an amplifier's output node is constant, while it continues to deliver linear current. In the next region, the current amplitude is also constant. When an amplifier in the Doherty system is replaced with the new multi-amplifier building block, the reactance value or line length difference must be chosen so that it gives efficient outphasing operation in (usually the lower part of) the lowest active region of the replaced amplifier (where the original amplifier delivered linear current).

The division of the maximum output power between the constituent amplifiers also has new considerations. If there is an amplifier whose active region starts at a transition point above that of the substituted amplifier, only the constituent amplifier which is not outphasing will continue to deliver linear current in this higher region. This means that the division of output power between the amplifiers at maximum output amplitude is not the same as the division of power at the transition point. This in turn has the implication that the division of maximum output power between the amplifiers in the multi-amplifier building block must take into consideration the placement of the transition points in the original Doherty structure.

If no other transformations are used in the network, the transmission line impedances that are used in the building block, are equal to the optimal load resistance of the respective amplifiers. The rest of the amplifiers, as well as the transmission lines (or equivalent networks), that are used in the original Doherty system, remain unaffected by the substitution. The current delivered, the output node voltages, the dimensioning, everything stays the same. This also means that multiple insertions of the new building blocks can be made in the same original Doherty amplifier.

Figure 11:
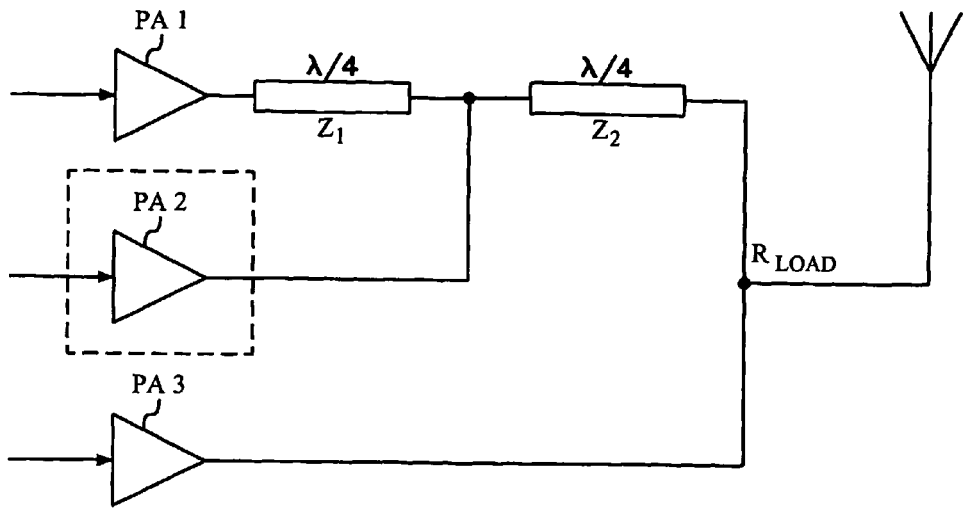
FIG. 11 is a block diagram of a prior art multi-stage Doherty amplifier.

As an example, consider the basic three-amplifier structure as a building block for replacing the second amplifier in a three-stage Doherty system, shown in FIG. 11. The resulting structure looks like the one shown in FIG. 12. Thus, the amplifier PA 2 indicated by the dashed block in FIG. 11 has been replaced by the three-amplifier structure indicated by the dashed block in FIG. 12. In this structure, the output power capability of PA 2 in the original Doherty system is divided between the three partial amplifiers PA 2,1, PA 2,2 and PA 2,3 of the new system. PA 1 and PA 3 operate in the same way in both the original Doherty system and the new system.

In this example, the impedances of the quarter-wavelength transmission lines in the Doherty system are: $Z_1=1.25$ times the optimal load of PA 3, $Z_2=0.25$ times the optimal load of PA 3. The transformed antenna impedance, $R_{LOAD}=0.2$ times the optimal load of PA 3.

Figure 12:
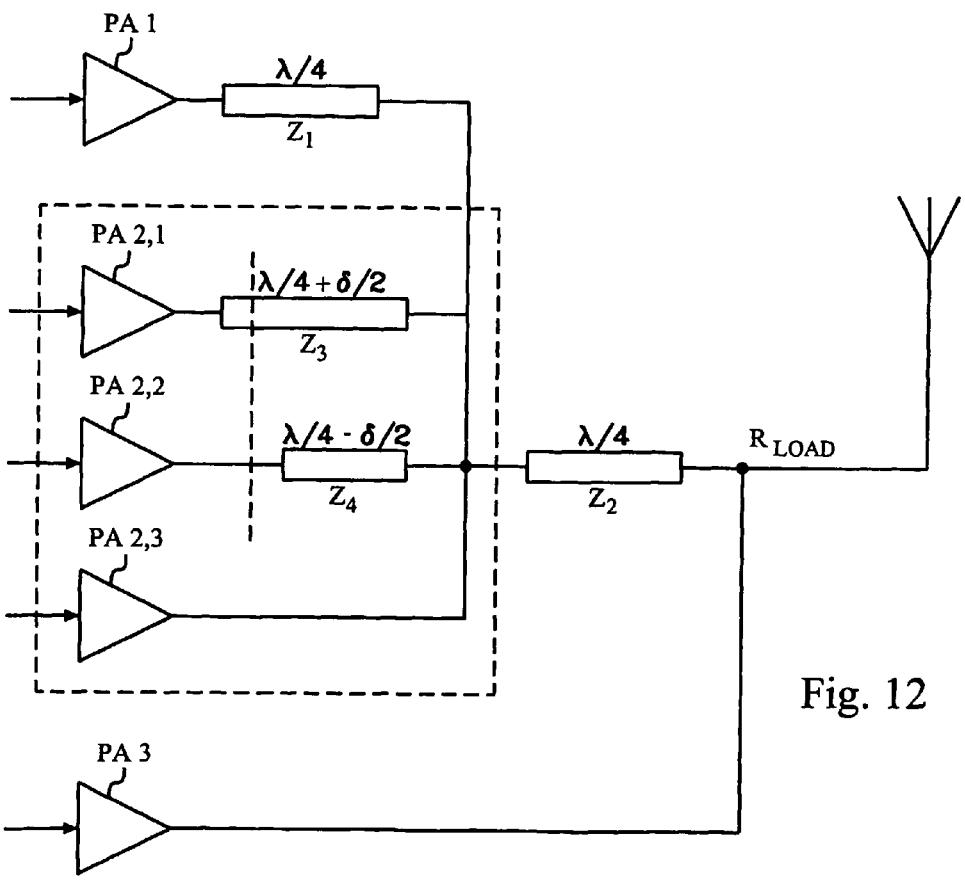
FIG. 12 is a block diagram of the multi-stage amplifier in FIG. 11, in which one amplifier has been replaced by a composite amplifier structure in accordance with the present invention.

In the new system of FIG. 12, with the structure consisting of PA 2,1, PA 2,2 and PA 2,3 plus shortened and lengthened transmission lines as in FIG. 4 replacing PA 2, the impedances of these transmission lines are: $Z_3=Z_4=1.25$ times the optimal load of PA 3. The line length difference is: $\delta=0.06\lambda$.

Figure 13:
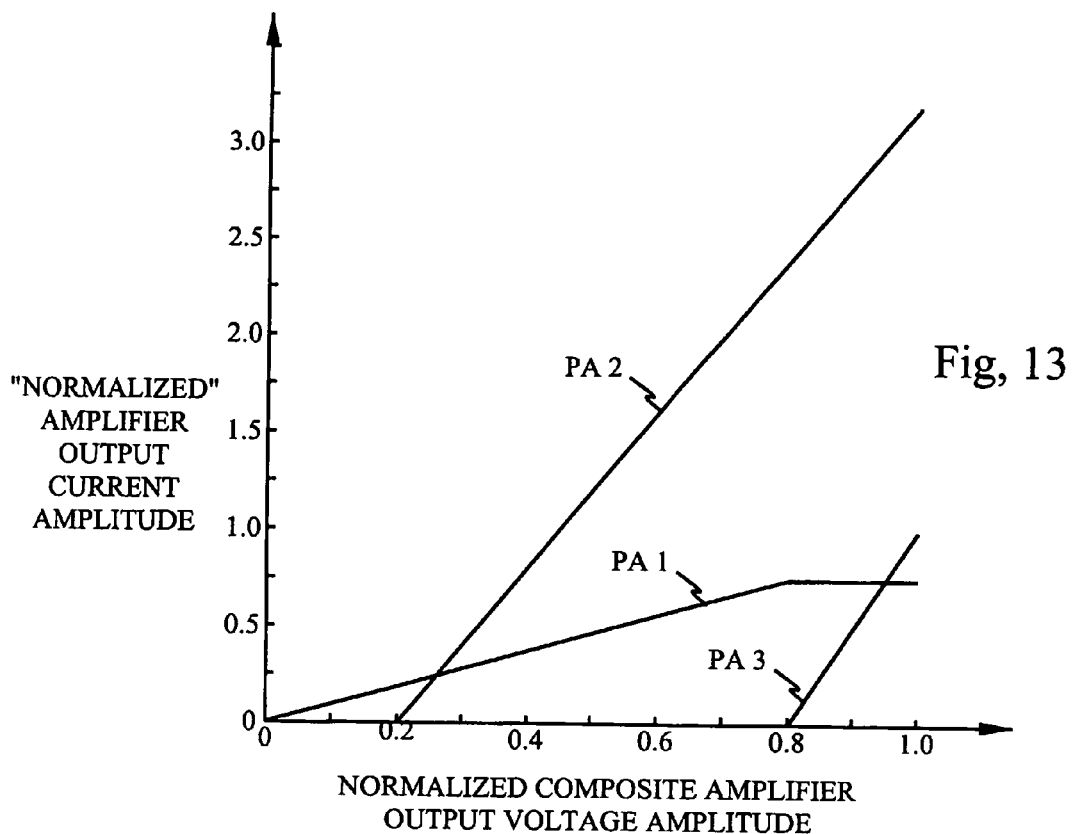
FIG. 13 is a diagram illustrating the dependence of the normalized output current amplitude of each amplifier on the normalized output voltage amplitude of the multi-stage Doherty amplifier in FIG. 11.
Figure 14:
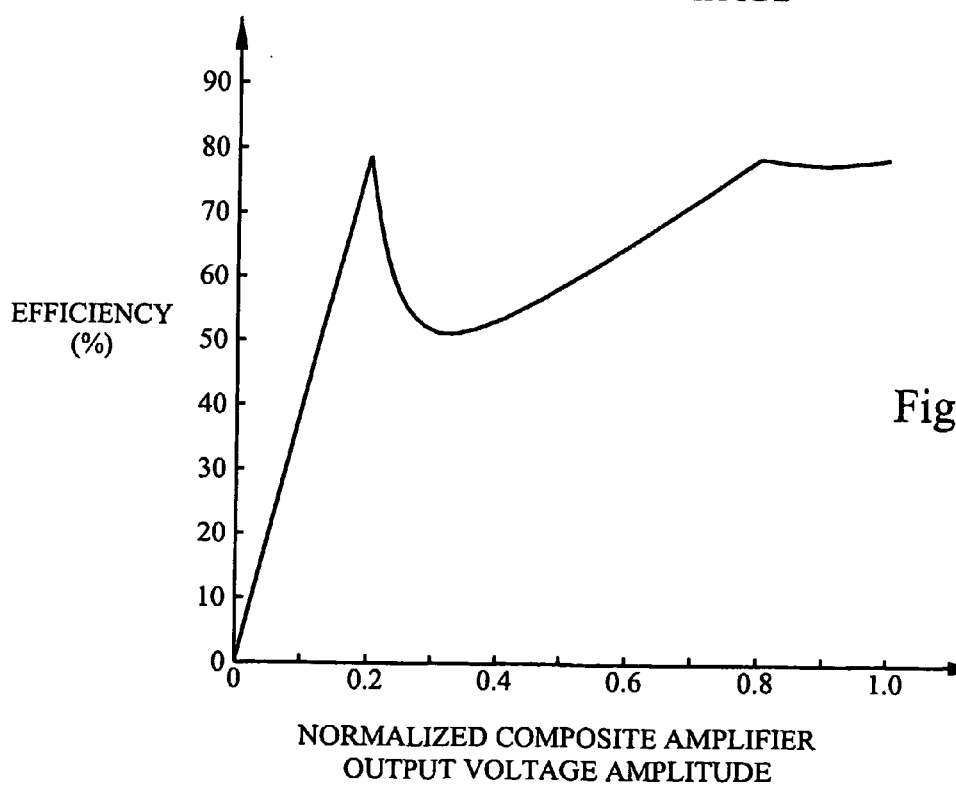
FIG. 14 is a diagram illustrating the efficiency as a function of the normalized output voltage of the multi-stage Doherty amplifier in FIG. 11.

The amplitudes of the RF currents from the constituent amplifiers of the three-stage Doherty system of FIG. 11 are shown in FIG. 13. The currents of the lower stages are normalized to the maximum output current of PA 3. The resulting efficiency of this reference system is shown in FIG. 14.

Figure 15:
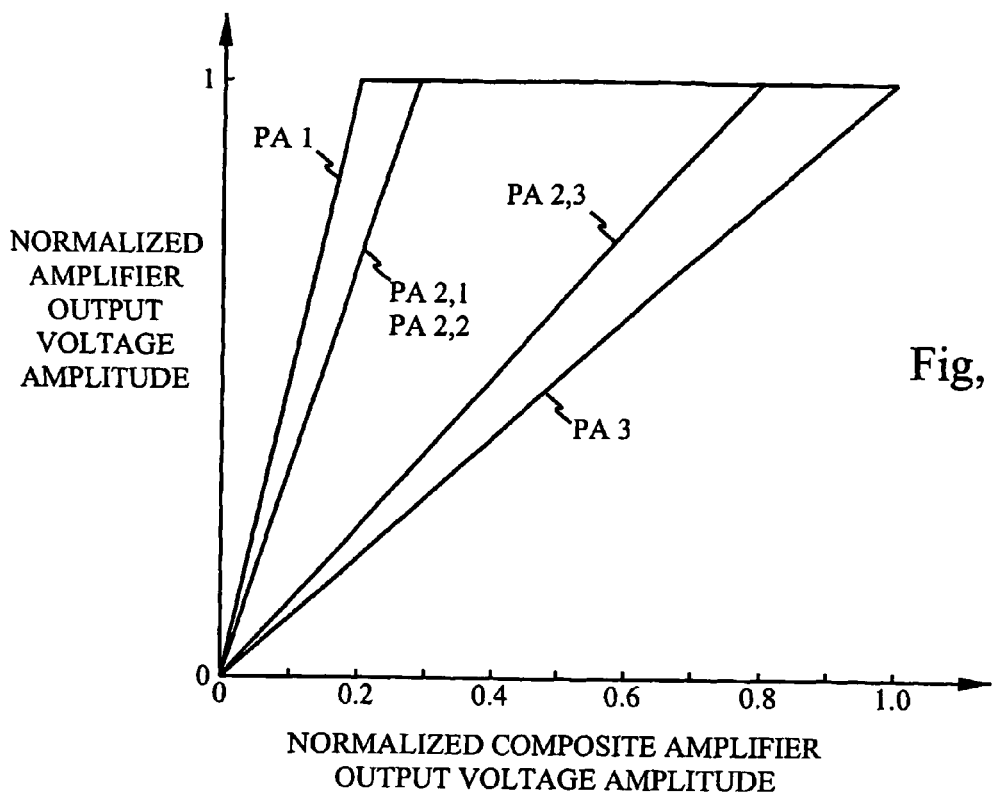
FIG. 15 is a diagram illustrating the dependence of the normalized output voltage amplitude of each amplifier on the normalized output voltage amplitude of the composite amplifier structure in accordance with FIG. 12.
Figure 16:
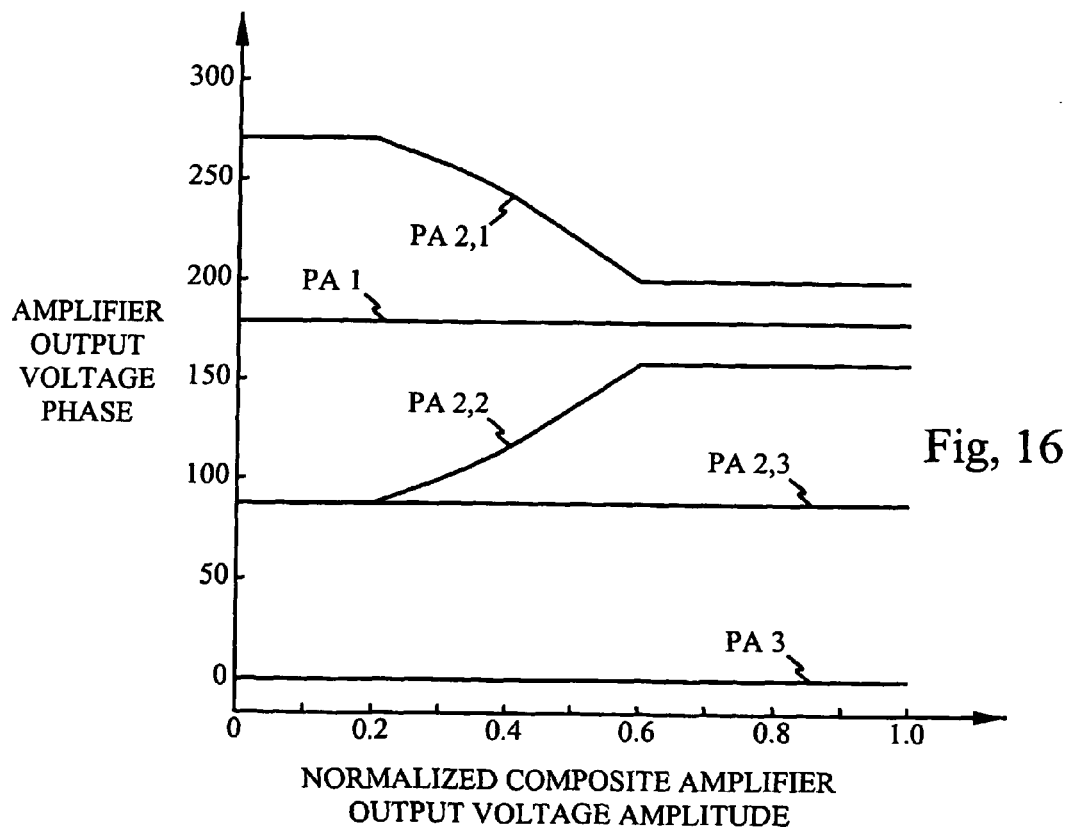
FIG. 16 is a diagram illustrating the dependence of the output voltage phase of each amplifier on the normalized output voltage amplitude of the composite amplifier structure in accordance with FIG. 12.

We now look at the same Doherty system, with PA 2 replaced by the combination of three partial amplifiers PA 2,1, PA 2,2 and PA 2,3, as shown in FIG. 12. In FIG. 15 and FIG. 16, the amplitudes and phases of the RF voltages at the output nodes of the amplifiers are shown. The output voltage at PA 3 is used as the phase reference for the other amplifiers.

Figure 17:
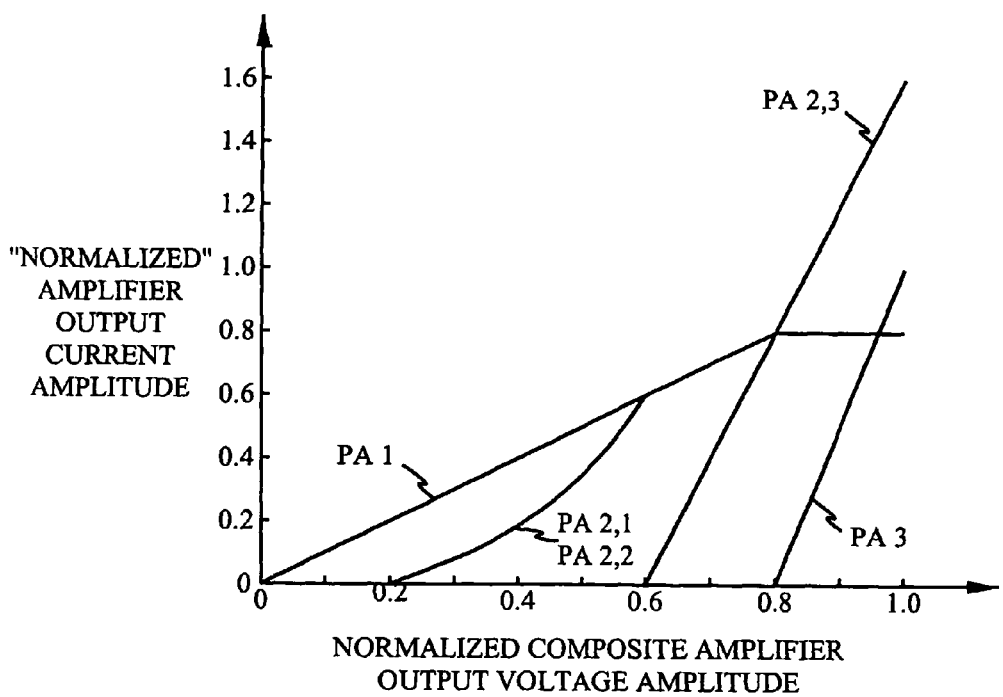
FIG. 17 is a diagram illustrating the dependence of the normalized output current amplitude of each amplifier on the normalized output voltage amplitude of the composite amplifier structure in accordance with FIG. 12.
Figure 18:
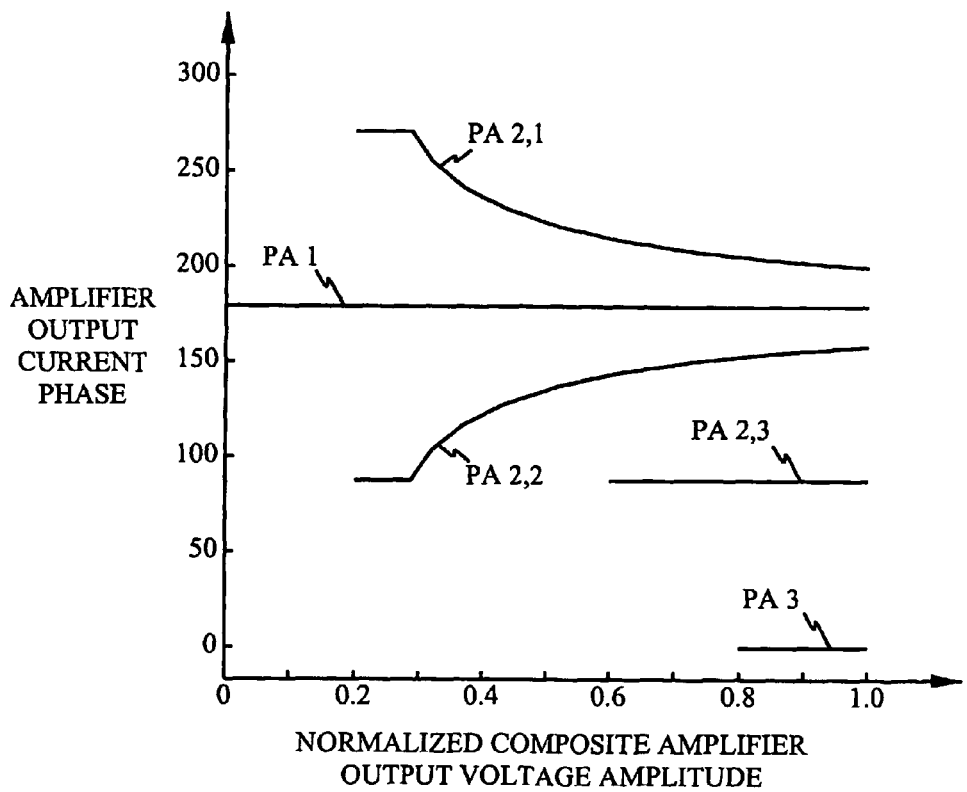
FIG. 18 is a diagram illustrating the dependence of the output current phase of each amplifier on the normalized output voltage amplitude of the composite amplifier structure in accordance with FIG. 12.

The amplitudes and phases of the RF currents delivered by the amplifiers in FIG. 12 are shown in FIG. 17 and FIG. 18. PA 1, PA 2,1 and PA 2,2 all deliver a maximum output current of 0.8 times that of PA 3. PA 2,3 delivers maximally twice that amount, i.e. 1.6 times that of PA 3. If we add the maximum currents of the amplifiers replacing PA 2 in the original Doherty system, we arrive at 3.2 times the maximum current of PA 3, which is the same as the maximum of the PA 2 output current in the original system. Note that the shape and size of the output current amplitude plots of PA 1 and PA 3 are identical to those of the original system as shown in FIG. 13.

Figure 19:
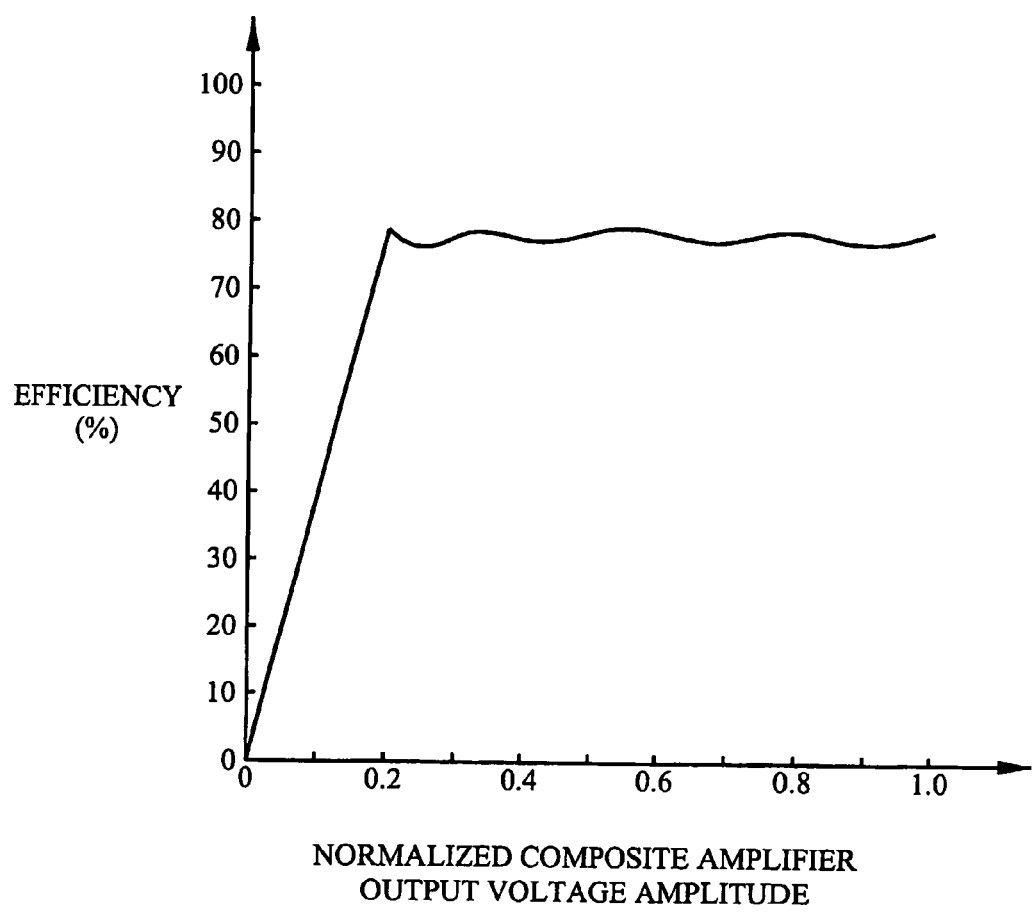
FIG. 19 is a diagram illustrating the efficiency as a function of the normalized output voltage of the composite structure in accordance with FIG. 12.

Thus, we have replaced PA 2 with a three-transistor structure that delivers the same maximum output current, but less average current, without affecting the rest of the system. Less current consumption means higher efficiency, which is evident by comparing the efficiency curve in FIG. 19 of the new system with the efficiency curve in FIG. 14 of the prior art system.

The three-amplifier system described so far can be expanded to any odd number of amplifiers, by essentially using a multi-stage Chireix structure in place of the single (two-amplifier) structure used so far. This has the benefit of further increasing efficiency. The order in which the different stages within an amplifier or building block operate in outphasing mode is determined by the size of the reactances. The division of the maximum output power between the Chireix part and the single (remaining) amplifier in the new multi-amplifier system follows the same considerations irrespective of the choice of single or multiple Chireix pairs in the system.

Figure 20:
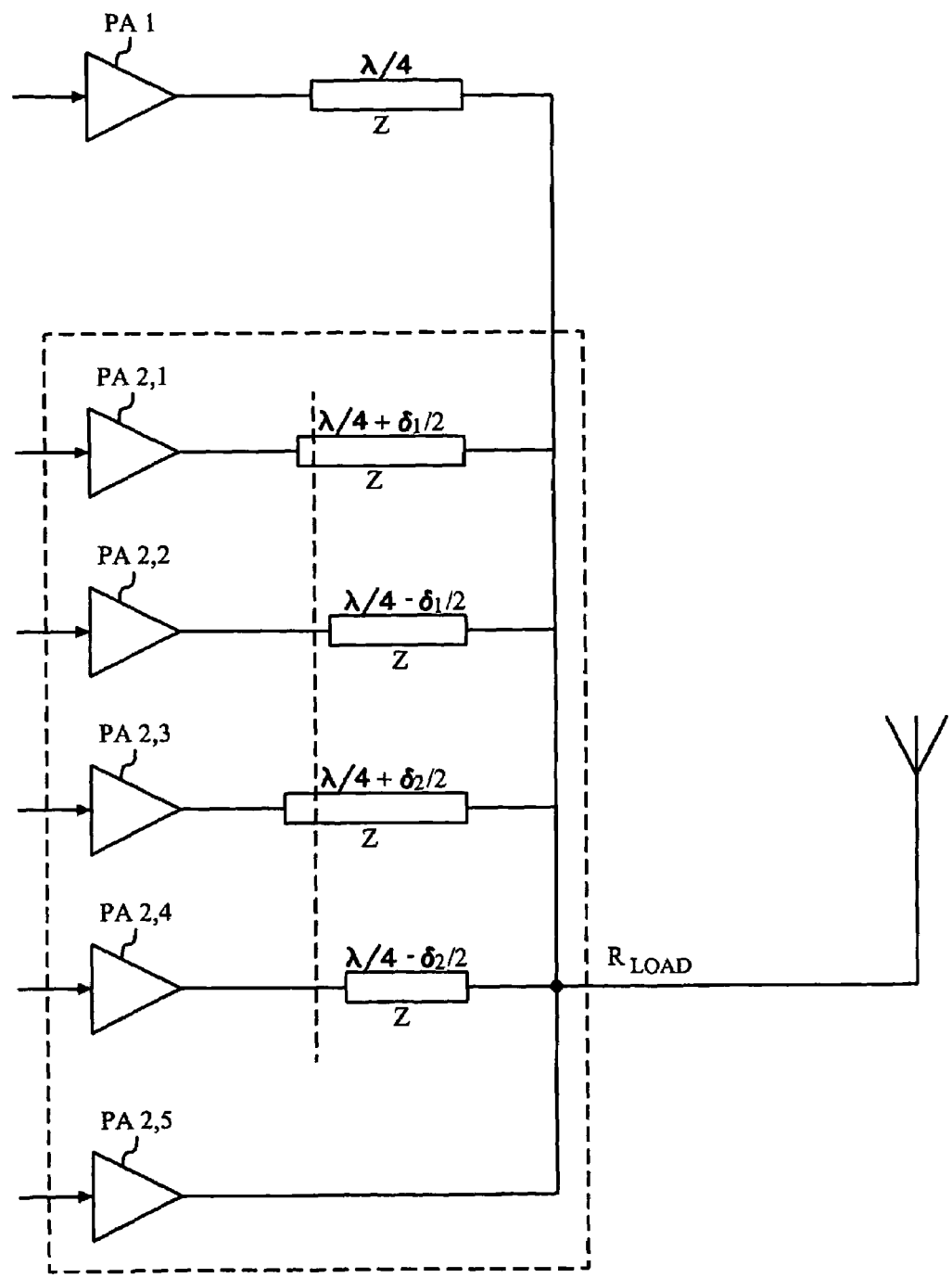
FIG. 20 is a block diagram of a Doherty amplifier, in which one amplifier has been replaced by a composite amplifier structure in accordance with the present invention including two Chireix pairs.

As an illustration of the use of higher order structures, consider the substitution of a system of five amplifiers for the second amplifier in a two-stage Doherty system. This particular amplifier is implemented with transmission lines, and all amplifiers are of equal size (same maximum output current and voltage). The structure is shown in FIG. 20. Since all amplifiers are of equal size, the transmission lines from all concerned amplifiers to the output are of equal impedance, Z. The line length differences are: $\delta_1=0.04\lambda$ and $\delta_2=0.09\lambda$. Since we have six amplifiers of equal size, the transformed antenna impedance, $R_{LOAD}$, has a value of one sixth of the optimal load of one amplifier.

Figure 21:
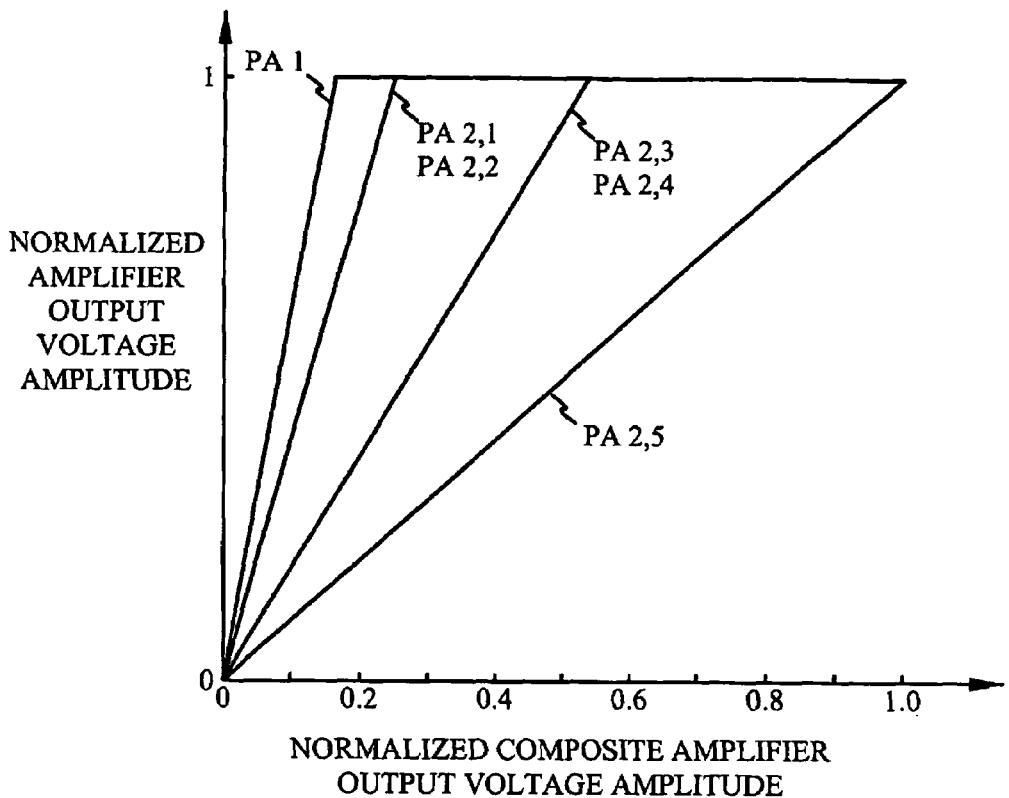
FIG. 21 is a diagram illustrating the dependence of the normalized output voltage amplitude of each amplifier on the normalized output voltage amplitude of the composite amplifier structure in accordance with FIG. 20.
Figure 22:
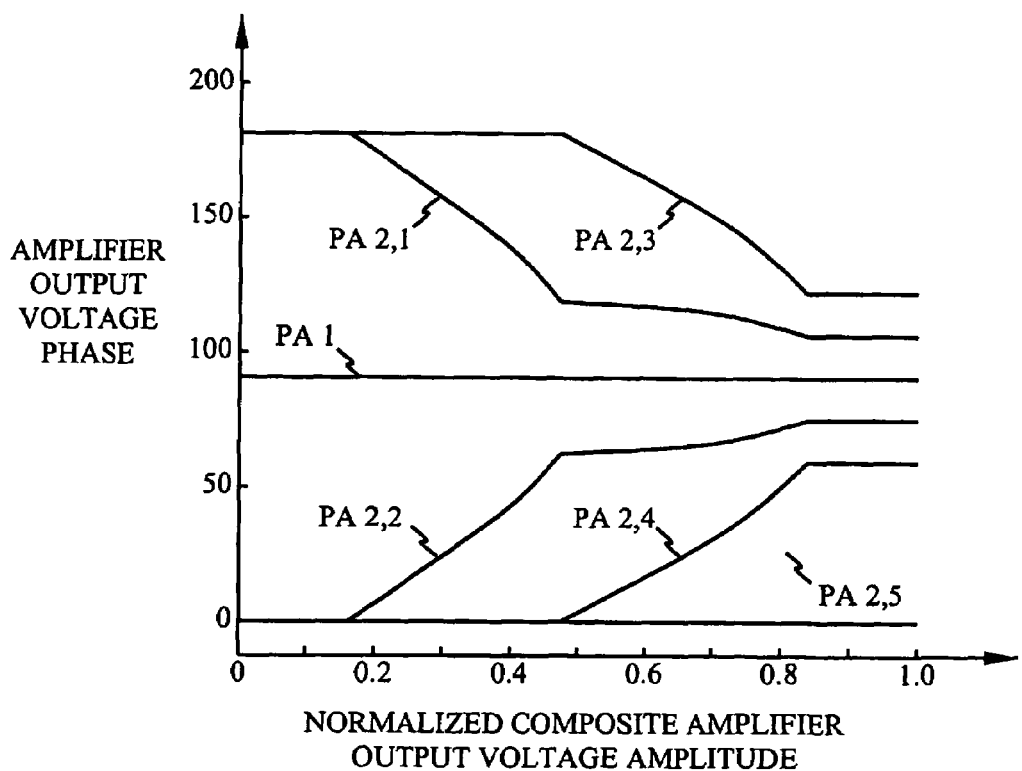
FIG. 22 is a diagram illustrating the dependence of the output voltage phase of each amplifier on the normalized output voltage amplitude of the composite amplifier structure in accordance with FIG. 20.

The amplitudes and phases of the voltages at the output nodes of the amplifiers are shown in FIG. 21 and FIG. 22, respectively. We see that the voltage at PA 2,5 contains the amplitude and phase of the desired output signal. The voltage at PA 1 leads the output by 90°, and is the first to reach its maximum. The two "Chireix pairs" PA 2,1+PA 2,2 and PA 2,3+PA 2,4 operate in outphasing mode during different regions of output amplitude, and have constant phase relative to the output in the uppermost sixth of the output amplitude range.

Figure 23:
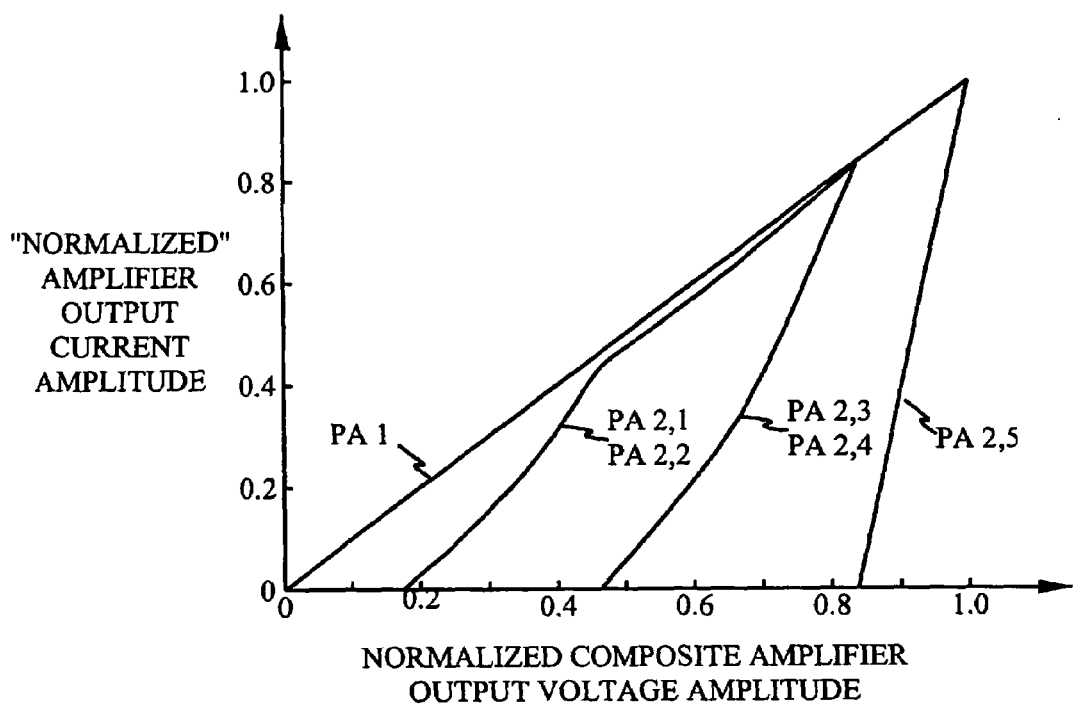
FIG. 23 is a diagram illustrating the dependence of the normalized output current amplitude of each amplifier on the normalized output voltage amplitude of the composite amplifier structure in accordance with FIG. 20.
Figure 24:
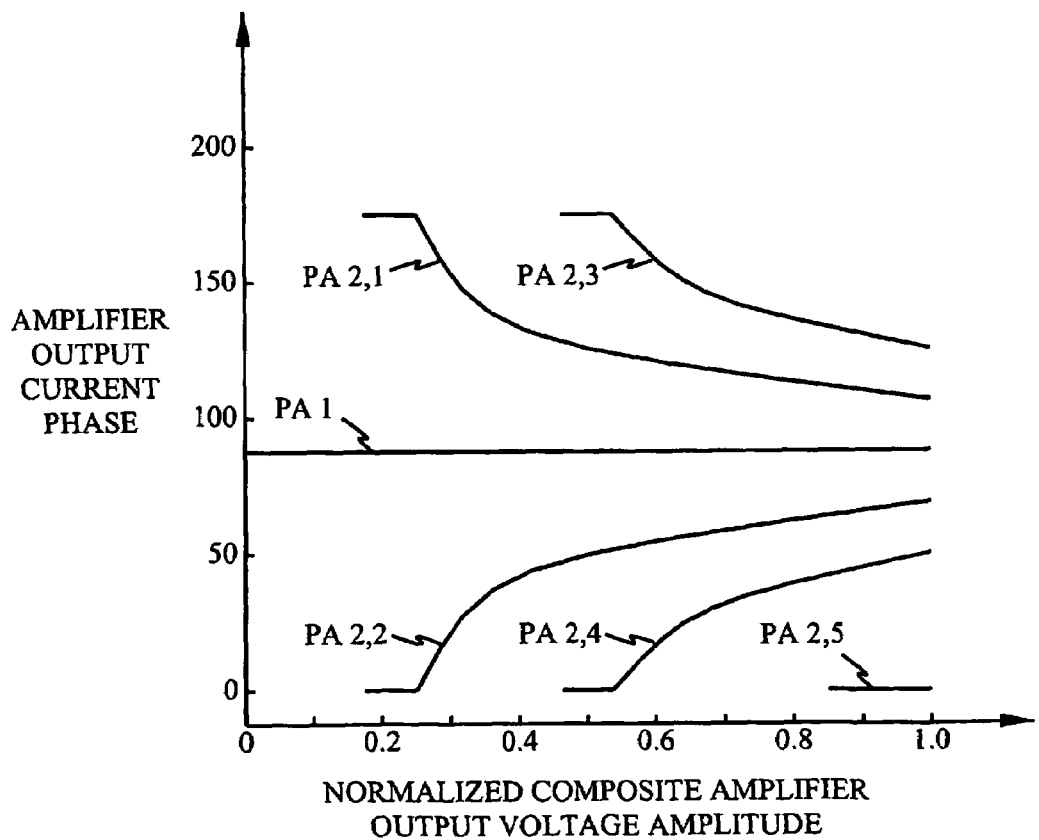
FIG. 24 is a diagram illustrating the dependence of the output current phase of each amplifier on the normalized output voltage amplitude of the composite amplifier structure in accordance with FIG. 20.

The amplitudes and phases of the currents are shown in FIG. 23 and FIG. 24, respectively. The phase plots are only shown for the region in which each amplifier is active (delivering current). We see that PA 1 is active during all output levels, as expected from the first stage of a two-amplifier Doherty system. The two "Chireix pairs" are active above approximately 0.17 and 0.47 of the output amplitude, respectively. PA 2,5 is active in the uppermost sixth of the output amplitude range.

Figure 25:
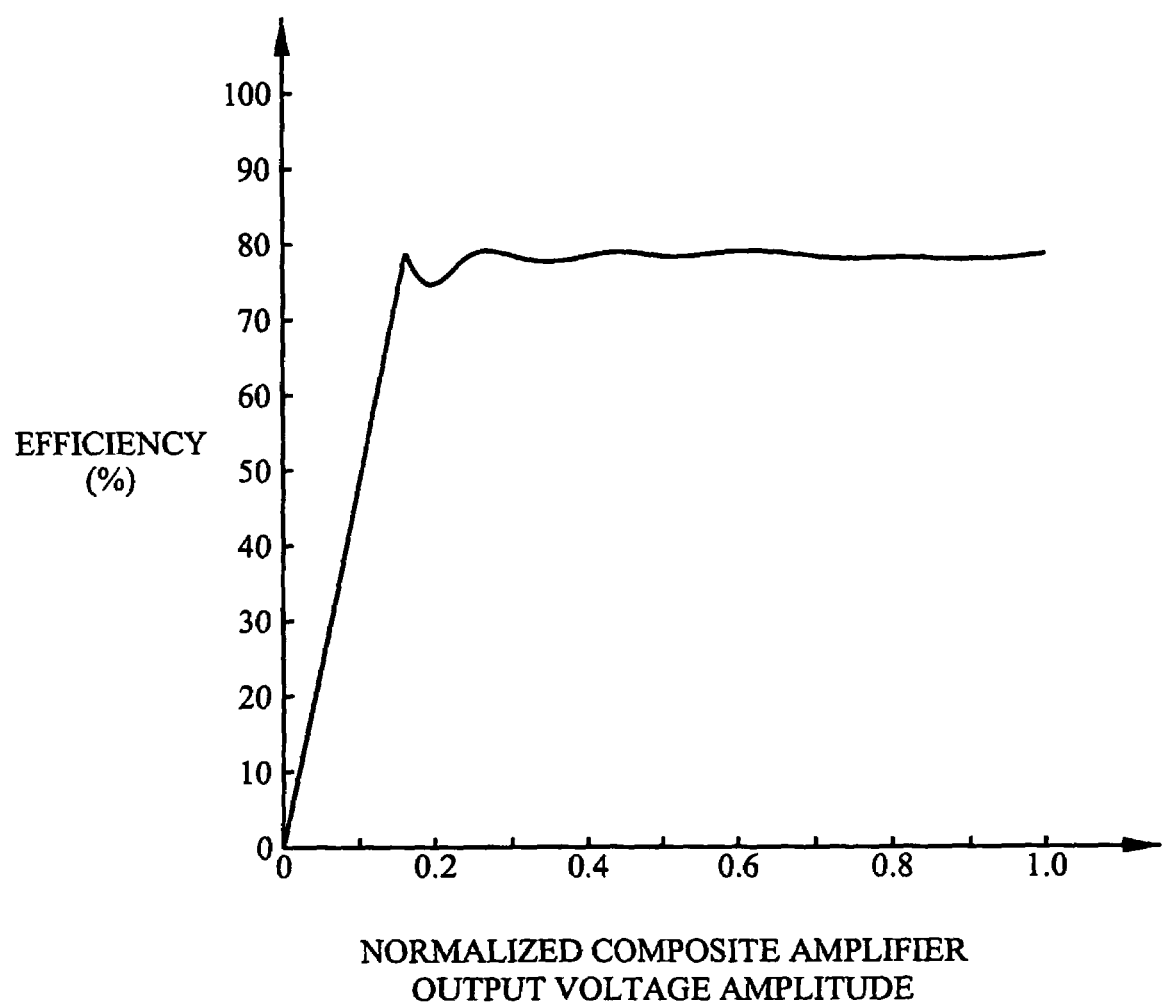
FIG. 25 is a diagram illustrating the efficiency as a function of the normalized output voltage of the composite structure in accordance with FIG. 20.

The resulting efficiency for the six-amplifier system, assuming linear transistors in class B operation, is shown in FIG. 25.

Figure 26:
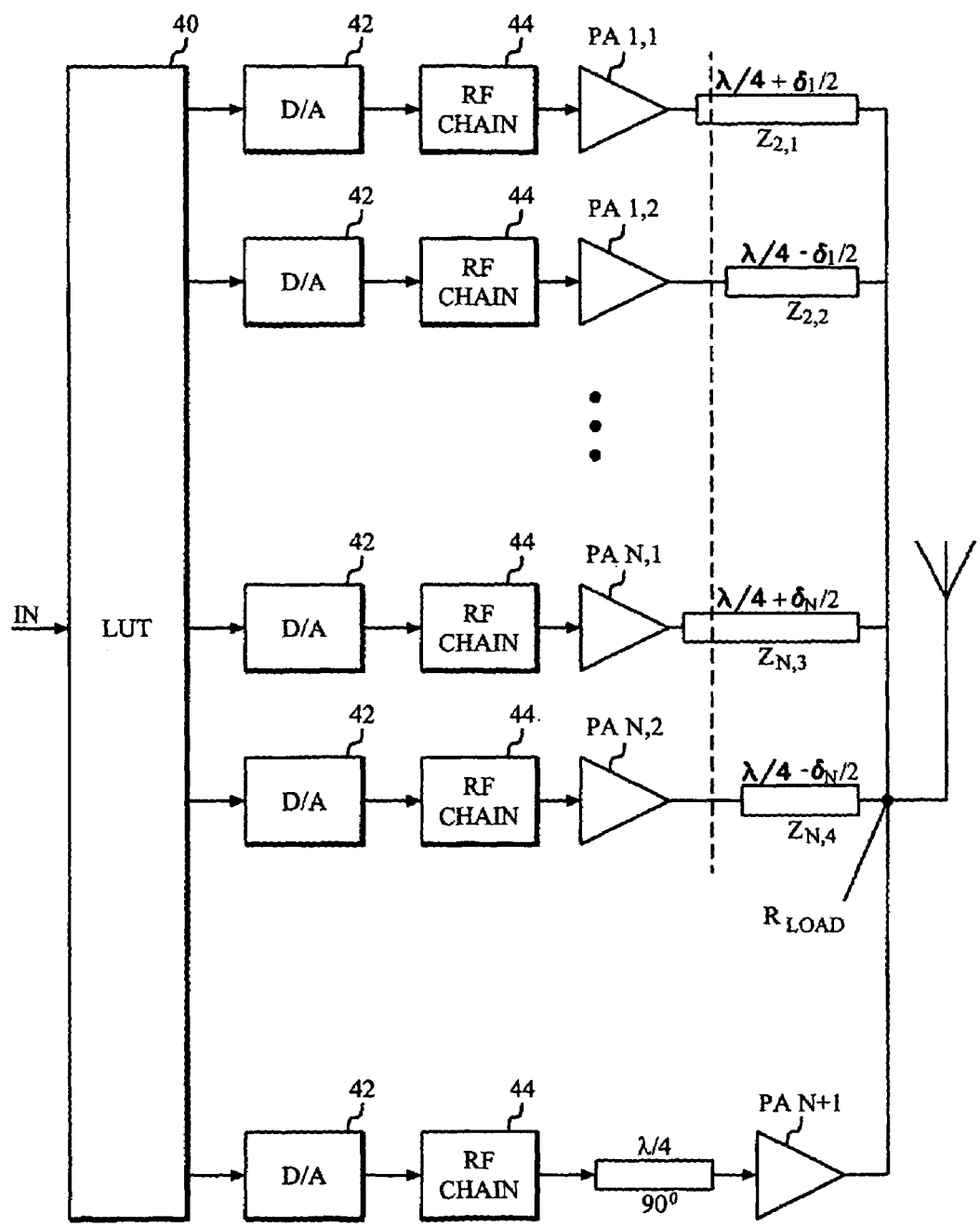
FIG. 26 is a block diagram illustrating an exemplary embodiment of the input network of a composite amplifier structure in accordance with the present invention.

The described efficient modes may, for example, be implemented by an amplifier input network in accordance with FIG. 26. A digital input signal IN is forwarded to a vector lookup table 40, where a single input signal value generates an output signal vector. Each vector component is then forwarded to a D/A converter 42 and thereafter to the respective RF chain 44. This transforms the digital input signal amplitude into the proper drive signals (the input signal amplitude is assumed to be proportional to the composite amplifier output voltage amplitude).

By use of the invention as a stand-alone amplifier, it is possible to obtain higher efficiency than with multi-stage Doherty networks with the same number of transistors (amplifiers). This is because more of the peaks in the efficiency curve are flat (rounded) rather than peaked (as in the classical Doherty case). The invention is, for many commonly occurring signal amplitude distributions, more efficient than prior systems consisting of an odd number of amplifiers.

Another advantage is that more evenly sized (and possibly equal size) transistors can be used, as compared to a Doherty amplifier. This is useful, since often only a limited number of transistor sizes are available from the manufacturers.

It is also possible to use the invention for "transparently" replacing one or more of the amplifiers in a Doherty system. The proposed structure is the only one that can do this, with good efficiency and good usage of the resources. This can be useful, as it leads to many alternative ways of building efficient systems with both even and odd numbers of amplifiers.

It will be understood by those skilled in the art that various modifications and changes may be made to the present invention without departure from the scope thereof, which is defined by the appended claims.

REFERENCES

[1] W. H. Doherty, "A New High Efficiency Power Amplifier for Modulated Waves", Proc. IRE, vol. 24, no. 9, pp. 1163–1182, September 1936.
[2] H. Chireix, "High Power Outphasing Modulation", Proc. IRE, vol. 23, no. 2, pp. 1370–1392, November 1935.
[3] F. H. Raab, "Efficiency of Doherty RF Power Amplifier Systems", IEEE Trans. Broadcasting, vol. BC-33, no. 3, pp. 77–83, September 1987.
[4] F. H. Raab, "Efficiency of Outphasing RF Power Amplifier Systems", IEEE Trans. Communications, vol. COM-33, no. 10, pp. 1094–1099, October 1985.
[5] B. Stengel and W. R. Eisenstadt, "LINC Power Amplifier Combiner Method Efficiency Optimization", IEEE Trans. Vehicular Technology, vol. 49, no. 1, pp. 229–234, January 2000.
[6] K. Meinzer, "Method and System for the Linear Amplification of Signals", U.S. Pat. No. 5,012,200.
[7] WO 01/91282 A2.

The invention claimed is:

1. A composite power amplifier structure, comprising:
a first power amplifier configured as an auxiliary amplifier of a Doherty amplifier and connected to an output node; and
an even number of further power amplifiers configured into at least one Chireix pair connected to said output node; and
circuitry for driving at least one Chireix pair by drive signals having amplitude dependent phase over at least a part of the dynamic range of the composite amplifier structure.

2. The amplifier structure of claim 1, wherein the circuitry is configured to drive at least one Chireix pair in outphasing mode over at least a part of the dynamic range of the composite amplifier structure.

3. The amplifier structure of claim 2, wherein the circuitry is configured to drive at least two Chireix pairs in outphasing mode over different parts of the dynamic range of the composite amplifier structure.

4. The amplifier structure of claim 2, wherein the circuitry is configured to drive for driving at least one Chireix pair with substantially linear current amplitudes above its corresponding outphased part of the dynamic range of the composite amplifier structure.

5. The amplifier structure of claim 2, wherein the circuitry is configured to drive for driving at least one Chireix pair with substantially linear current amplitudes below its corresponding outphased part of the dynamic range of the composite amplifier structure.

6. The amplifier structure of claim 1, wherein the circuitry is configured to drive for driving said first power amplifier with substantially zero current amplitudes below and substantially linear current amplitudes above a predetermined output node voltage amplitude.

7. The amplifier structure of claim 1, wherein said structure forms a stand-alone composite amplifier.

8. The amplifier structure of claim 1, wherein said structure forms part of a composite amplifier including further power amplifiers.

9. A radio terminal having a composite power amplifier structure, comprising:
a first power amplifier configured as an auxiliary amplifier of a Doherty amplifier and connected to an output node;
an even number of further power amplifiers configured into at least one Chireix pair connected to said output node; and
circuitry for driving at least one Chireix pair by drive signals having amplitude dependent phase over at least a part of the dynamic range of the composite amplifier structure.

10. The radio terminal of claim 9, wherein the circuitry is configured to drive least one Chireix pair in outphasing mode over at least a part of the dynamic range of the composite amplifier structure.

11. The radio terminal of claim 10, wherein the circuitry is configured to drive least two Chireix pairs in outphasing mode over different parts of the dynamic range of the composite amplifier structure.

12. The radio terminal of claim 10, wherein the circuitry is configured to drive least one Chireix pair with substantially linear current amplitudes above its corresponding outphased part of the dynamic range of the composite amplifier structure.

13. The radio terminal of claim 10, wherein the circuitry is configured to drive at least one Chireix pair with substantially linear current amplitudes below its corresponding outphased part of the dynamic range of the composite amplifier structure.

14. The radio terminal of claim 9, wherein the circuitry is configured to drive said first power amplifier with substantially zero current amplitudes below and substantially linear current amplitudes above a predetermined output node voltage amplitude.

15. The radio terminal of claim 9, wherein said structure forms a stand-alone composite amplifier.

16. The radio terminal of claim 9, wherein said structure forms part of a composite amplifier including further power amplifiers.

17. The radio terminal of claim 9, wherein said radio terminal is a mobile radio terminal.

18. The radio terminal of claim 9, wherein said radio terminal is a base station.

19. A method of driving a composite amplifier structure including an odd number of power amplifiers connected to a common load, said method comprising:
   driving a first power amplifier with substantially zero current amplitudes below and substantially linear current amplitudes above a predetermined output node voltage; and
   driving at least one Chireix pair by drive signals having amplitude dependent phase over at least a part of the dynamic range of the composite amplifier.

20. The method of claim 19, characterized by driving at least one Chireix pair in outphasing mode over at least a part of the dynamic range of the composite amplifier structure.

21. The method of claim 20, characterized by driving at least two Chireix pairs in outphasing mode over different parts of the dynamic range of the composite amplifier structure.

22. The method of claim 20, characterized by driving at least one Chireix pair with substantially linear current amplitudes above its corresponding outphased part of the dynamic range of the composite amplifier structure.

23. The method of claim 20, characterized by driving at least one Chireix pair with substantially linear current amplitudes below its corresponding outphased part of the dynamic range of the composite amplifier structure.

* * * * *